US006973421B1

(12) United States Patent
Bruno

(10) Patent No.: US 6,973,421 B1
(45) Date of Patent: Dec. 6, 2005

(54) BZFLASH SUBCIRCUIT TO DYNAMICALLY SUPPLY BZ CODES FOR CONTROLLED IMPEDANCE BUFFER DEVELOPMENT, VERIFICATION AND SYSTEM LEVEL SIMULATIONS

(75) Inventor: Kevin J. Bruno, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 846 days.

(21) Appl. No.: 09/934,051

(22) Filed: Aug. 21, 2001

(51) Int. Cl.[7] ........................ G06F 17/50; H03K 19/175
(52) U.S. Cl. ............................. 703/14; 326/30; 326/62
(58) Field of Search ............................ 703/14; 326/30, 326/62

(56) References Cited

U.S. PATENT DOCUMENTS

| | | | | |
|---|---|---|---|---|
| 5,751,161 | A * | 5/1998 | Wei et al. | 326/30 |
| 6,566,903 | B1 * | 5/2003 | Mandal et al. | 326/30 |

* cited by examiner

*Primary Examiner*—Hugh Jones
(74) *Attorney, Agent, or Firm*—Trexler, Bushnell, Giangiorgi, Blackstone & Marr Ltd.

(57) ABSTRACT

A design and verification aide that can be used to produce BZ codes under static or dynamic process, voltage, temperature and external reference resistor (PVT and R) conditions for impedance controlled buffers or any other application using BZ codes. The simulation technique follows that of a flash ADC, and effectively replaces an awkward state-machine BZ controller with a subcircuit consisting of 5 BZREFN's, 5 BZREFP's, 10 HSPICE behavioral comparators, and the BZVREF. The resulting N- and P-codes may be adjusted by a parameterized dither count with minimum and maximum code values enforced by the model, and the comparators can be modified to model offset voltage.

11 Claims, 12 Drawing Sheets

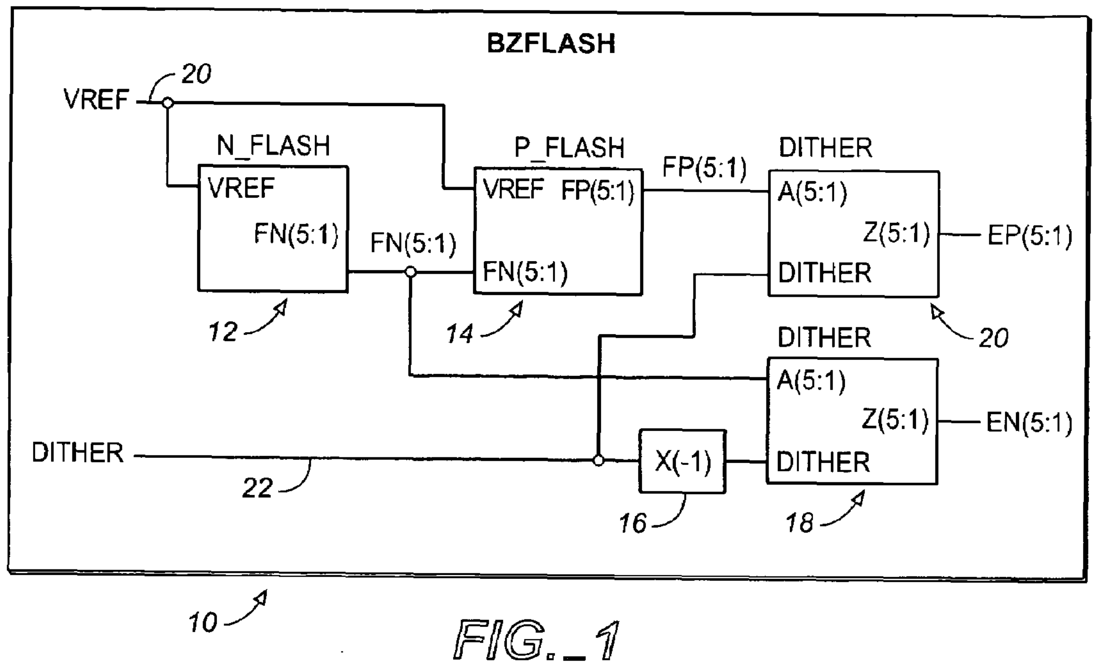
FIG._1
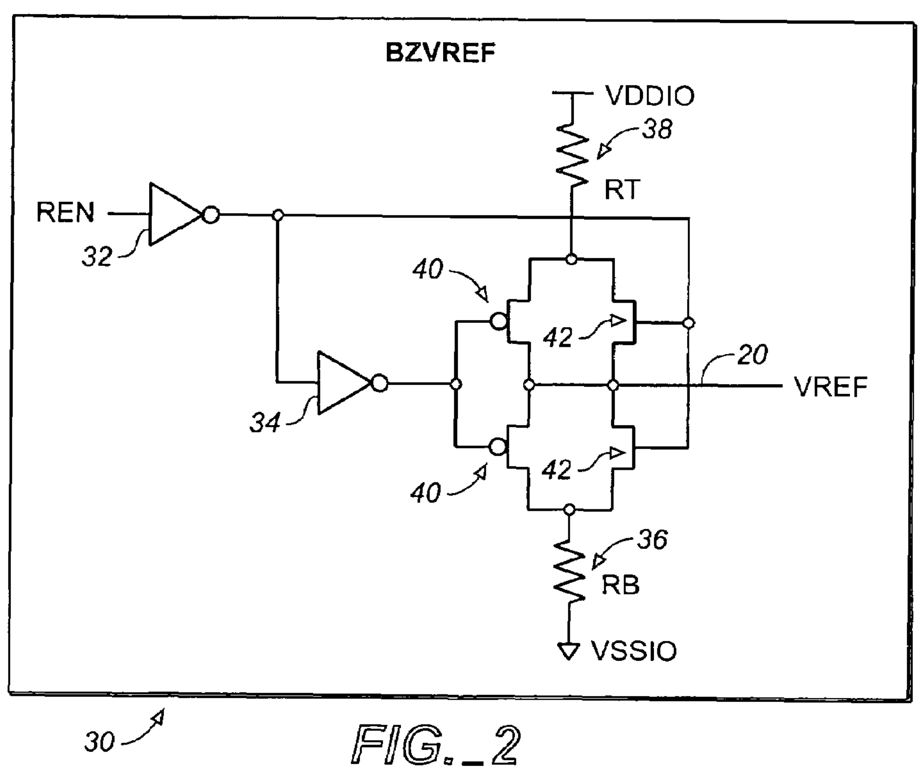
FIG._2

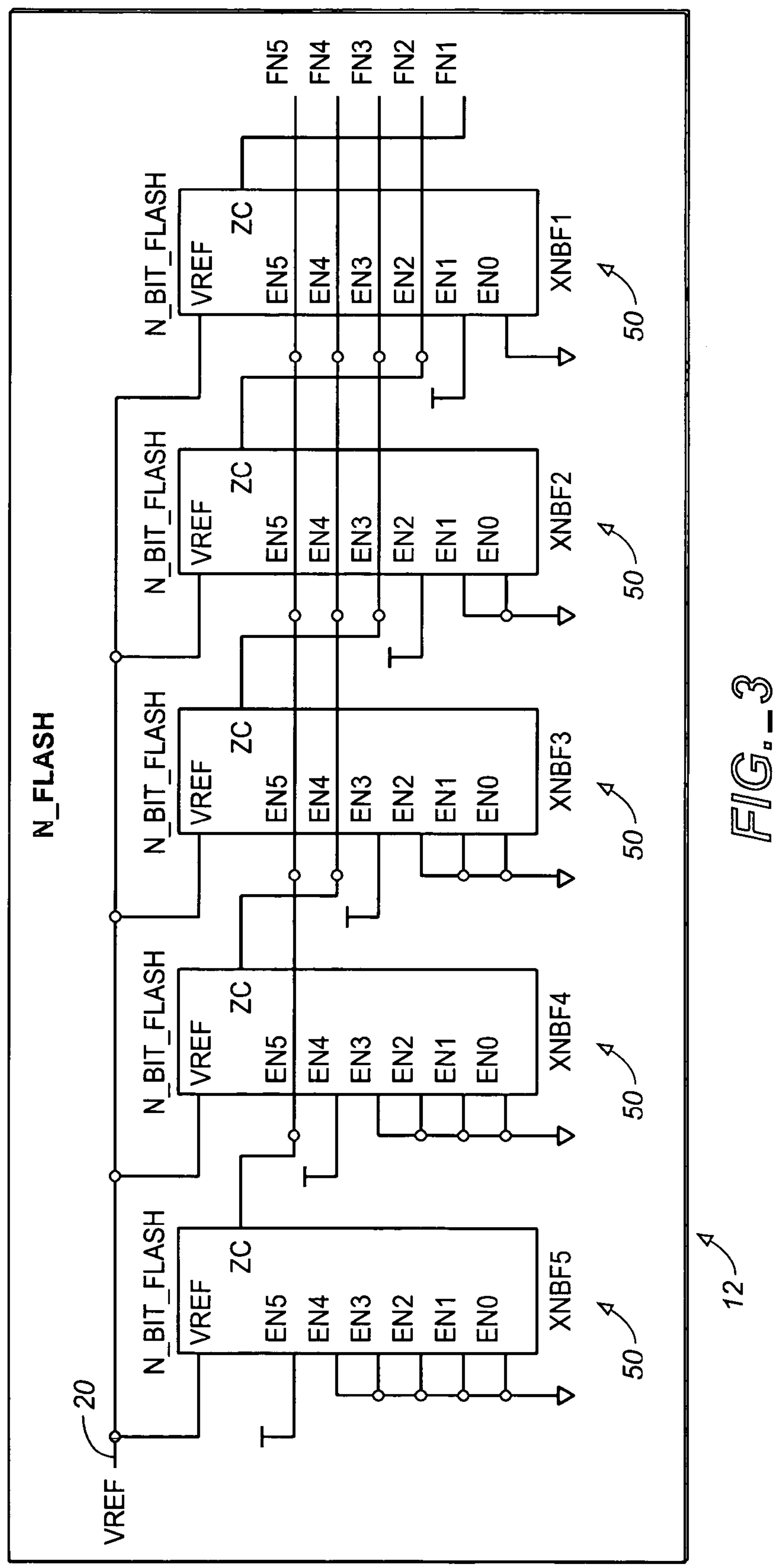
FIG._3

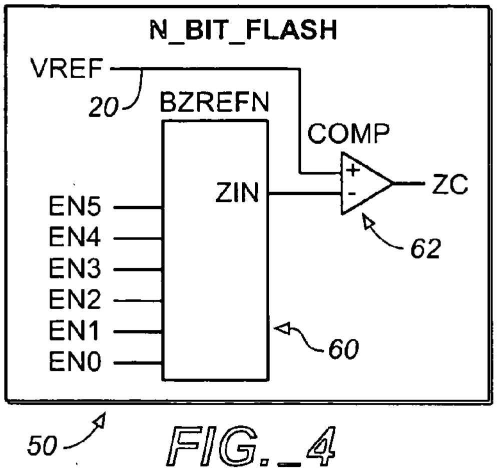
FIG._4
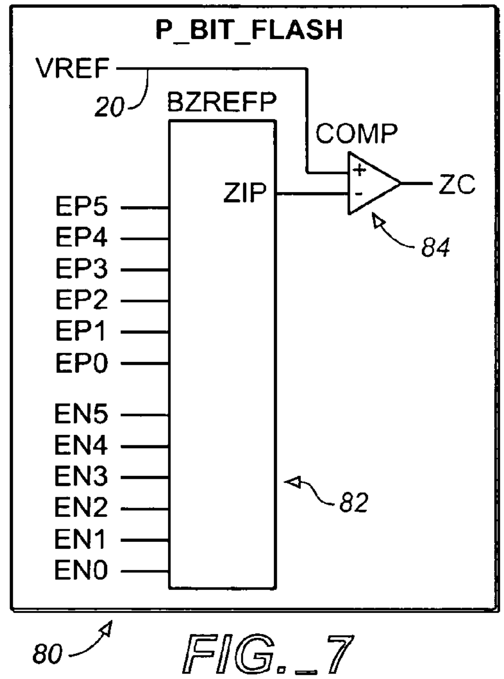
FIG._7
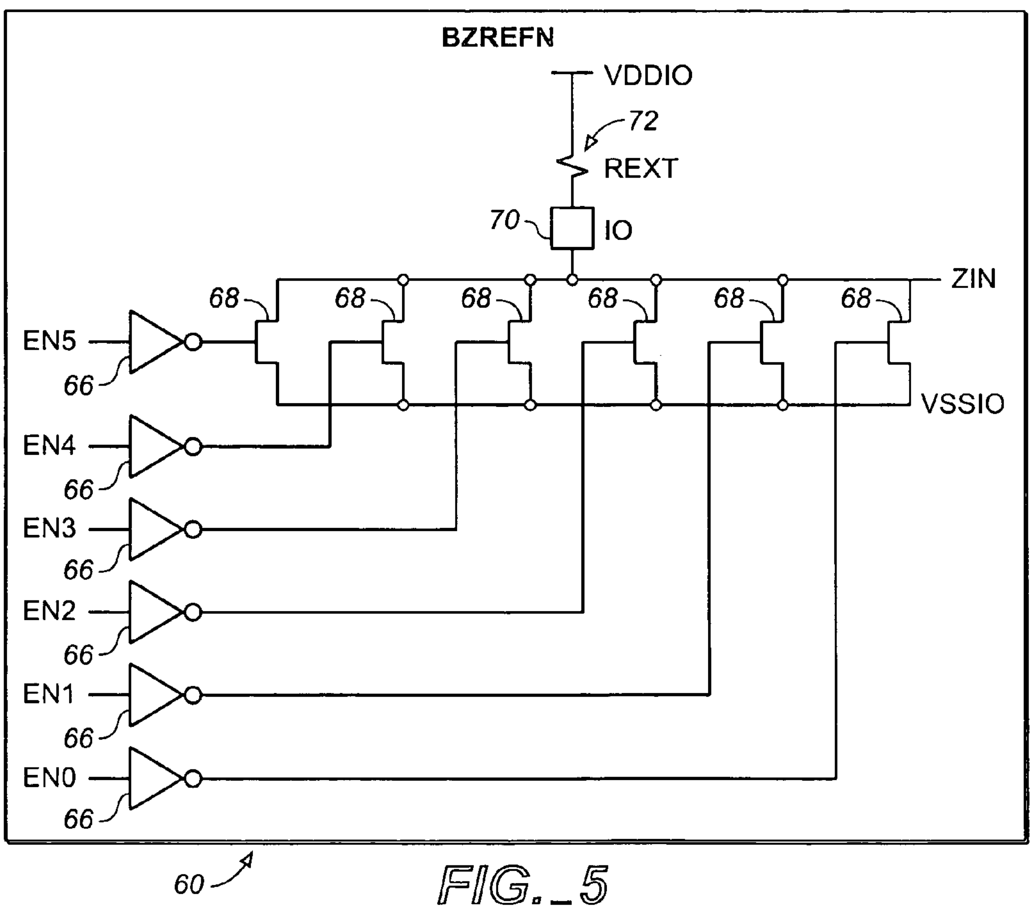
FIG._5

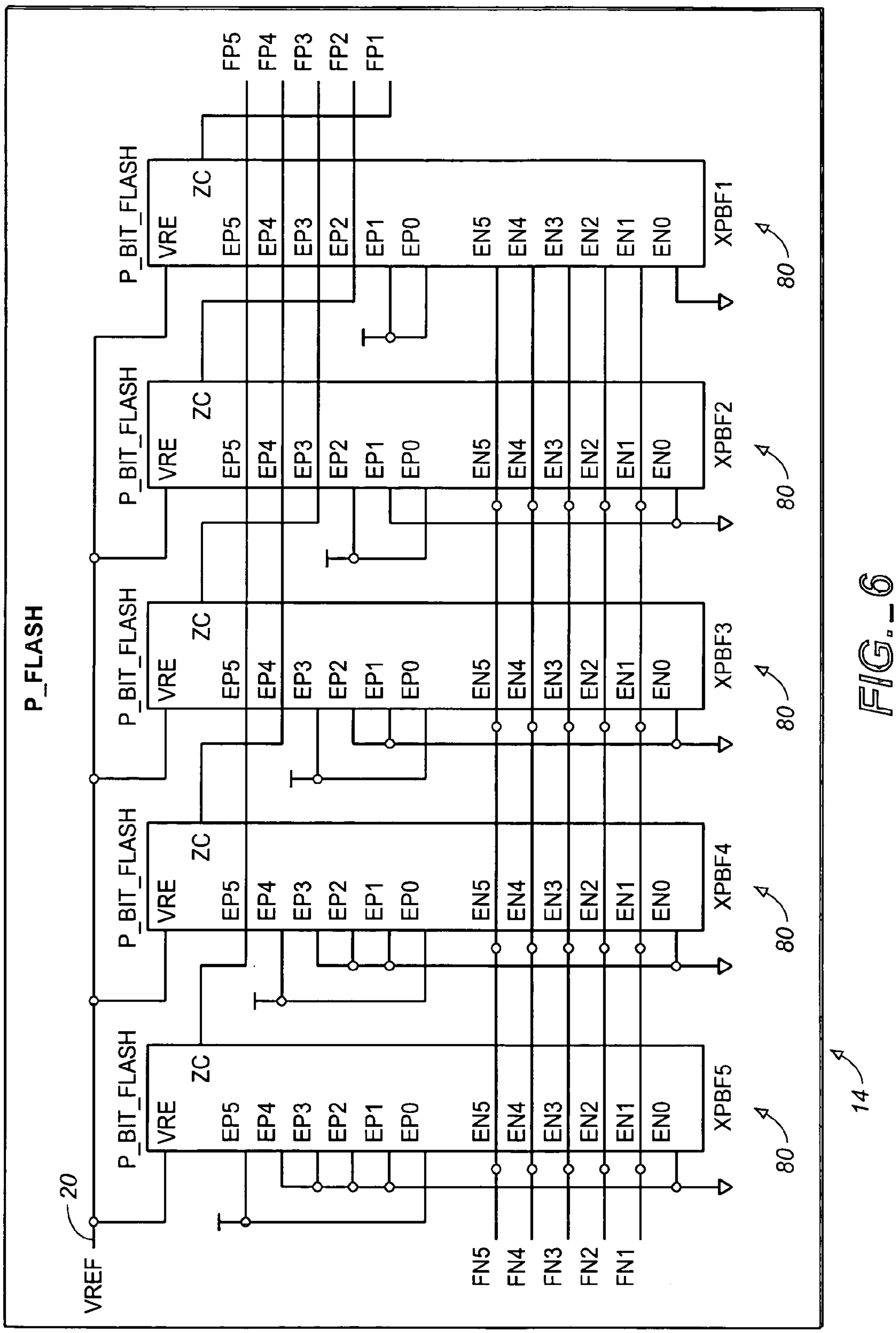
14
FIG._6

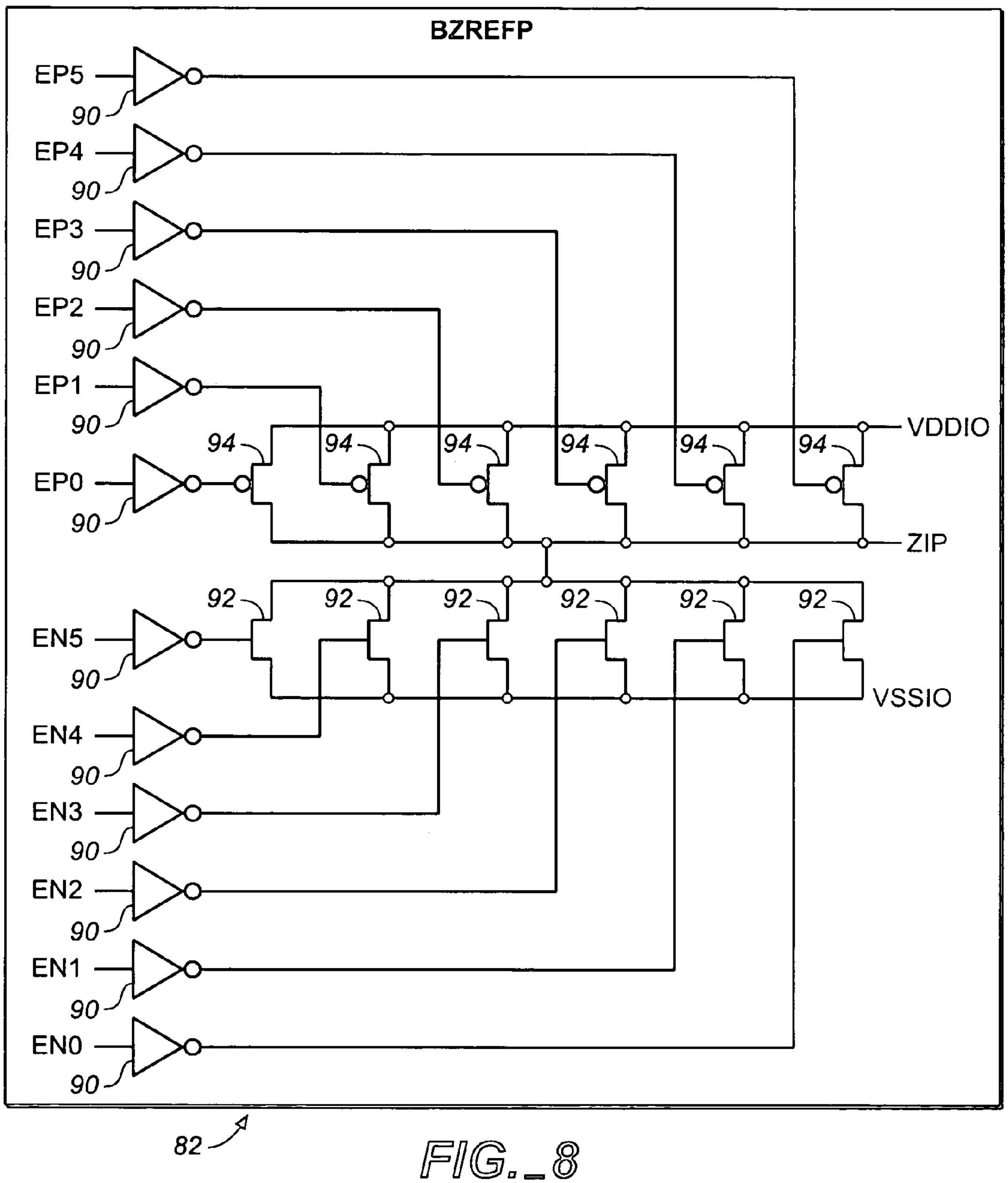
FIG._8

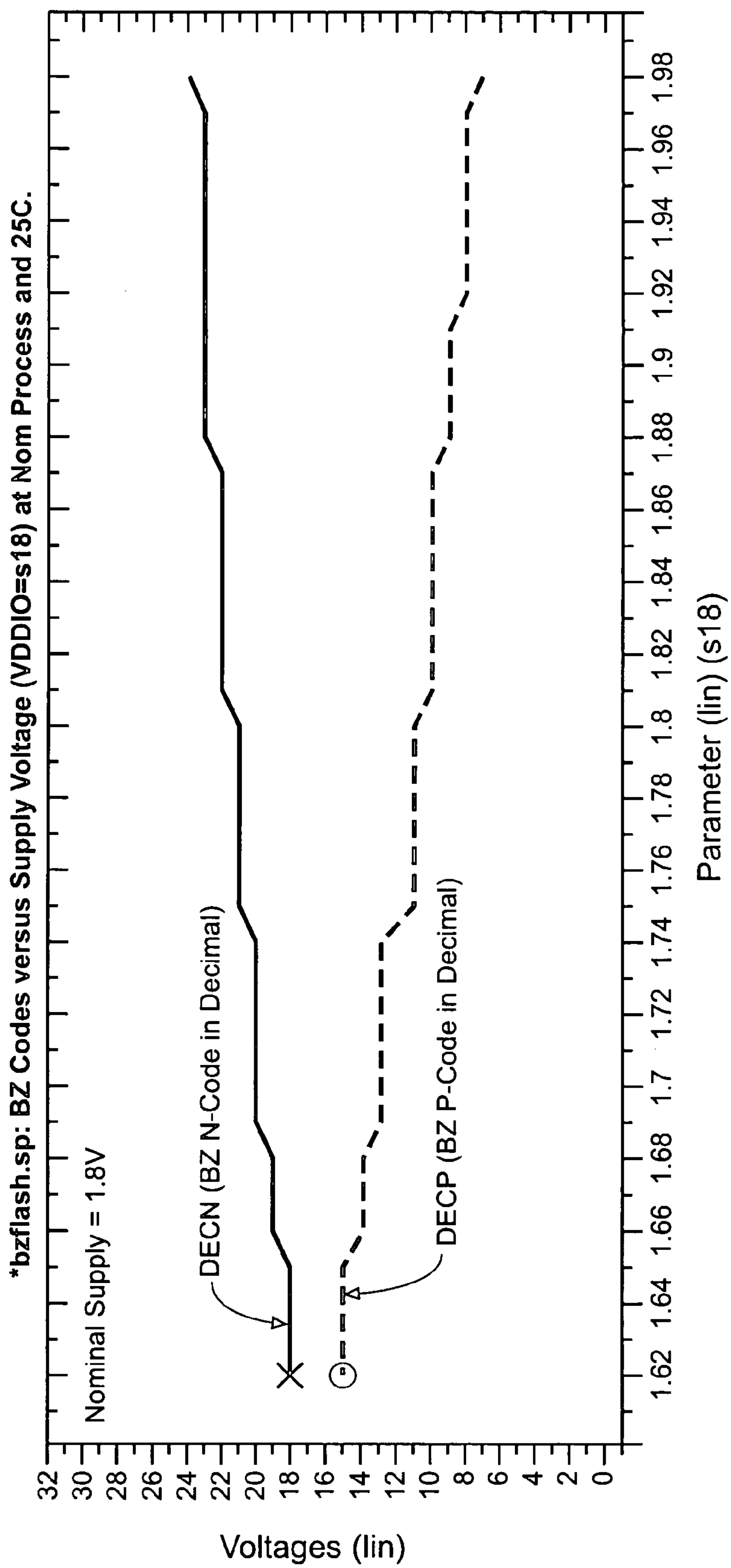
FIG._9A

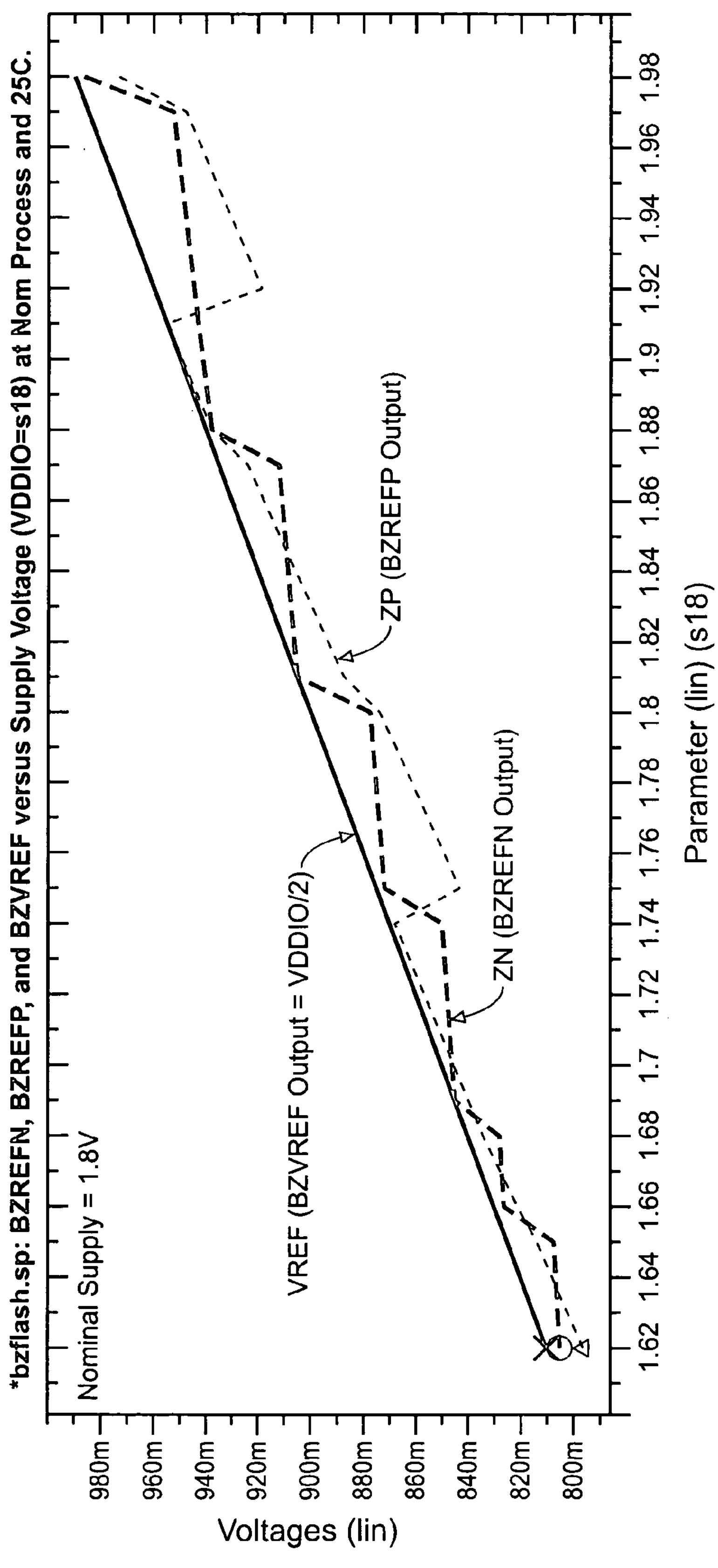
FIG._9B

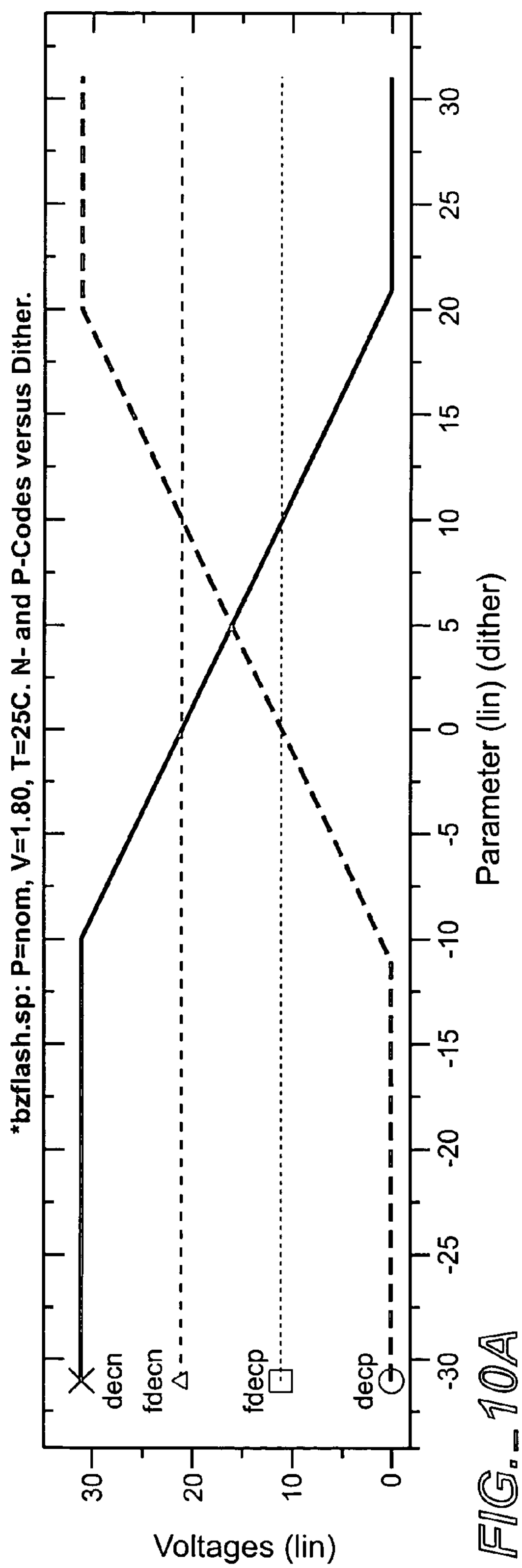
FIG._10A
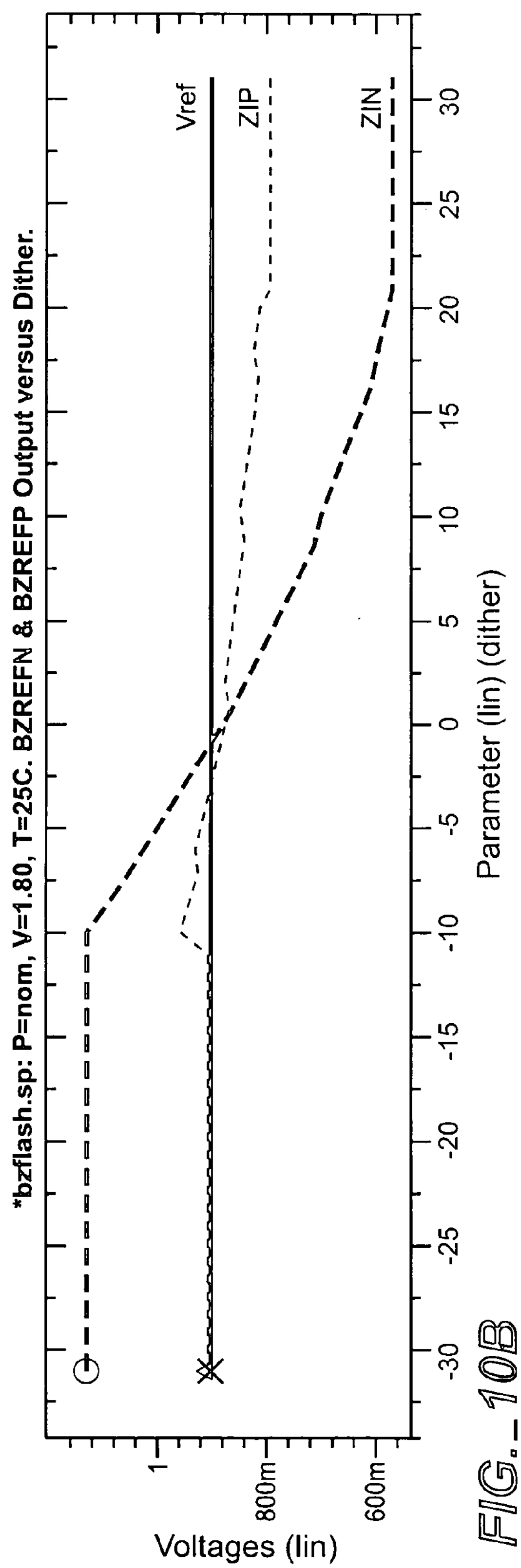
FIG._10B

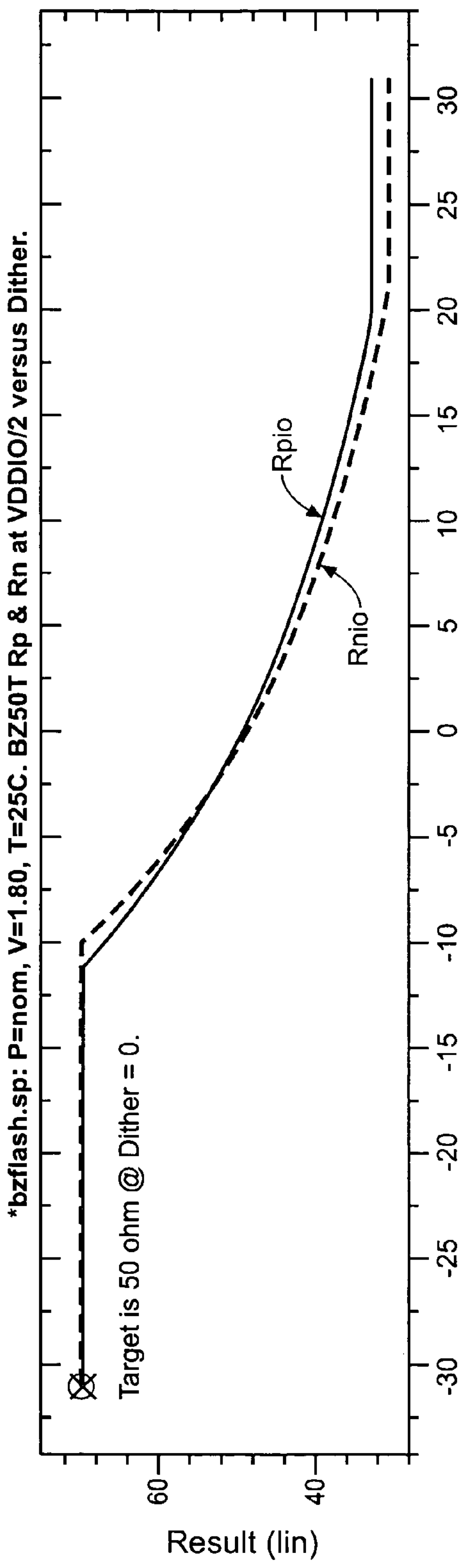
FIG._10C
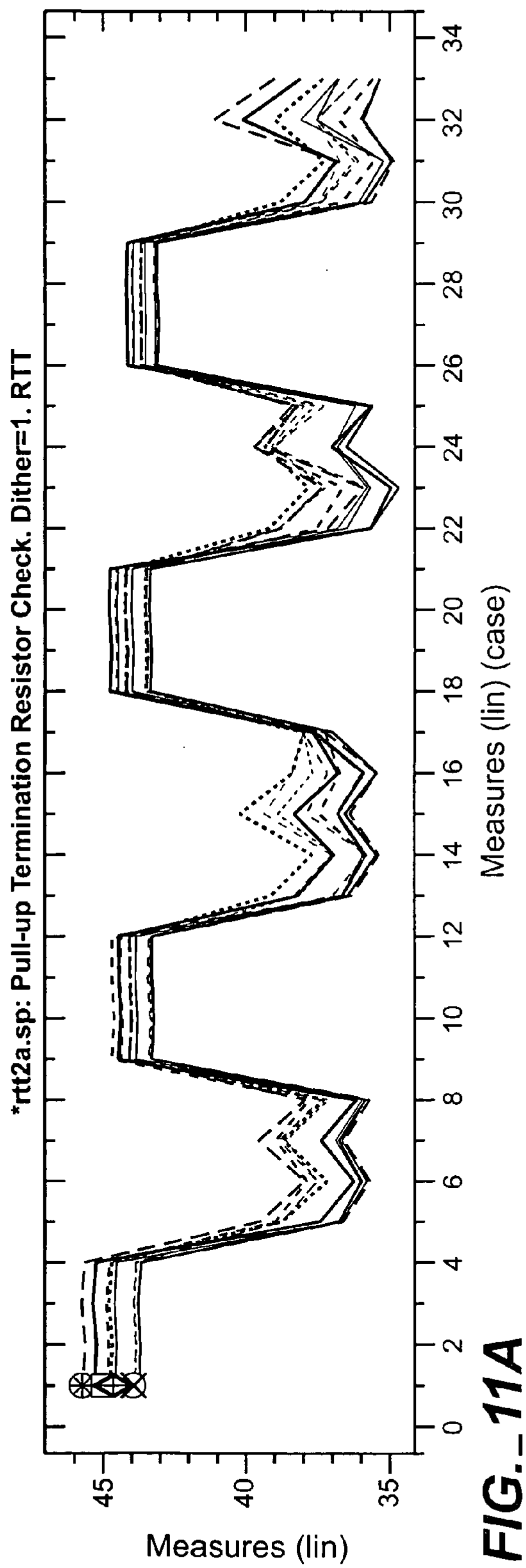
FIG._11A

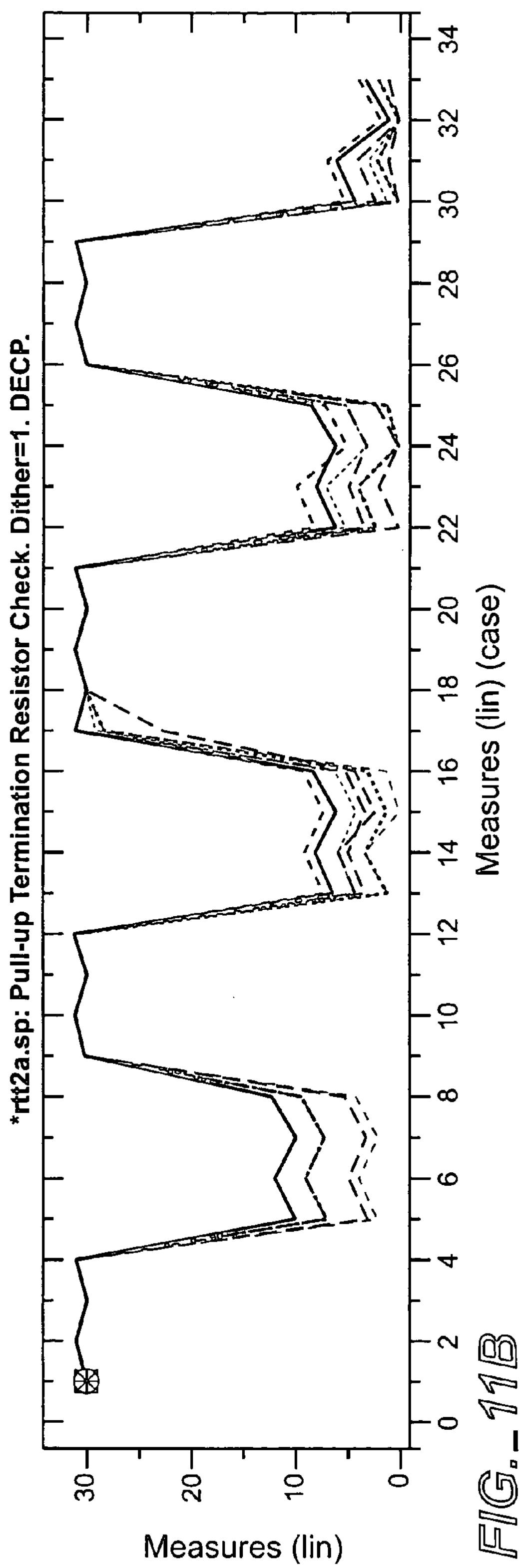
FIG._11B
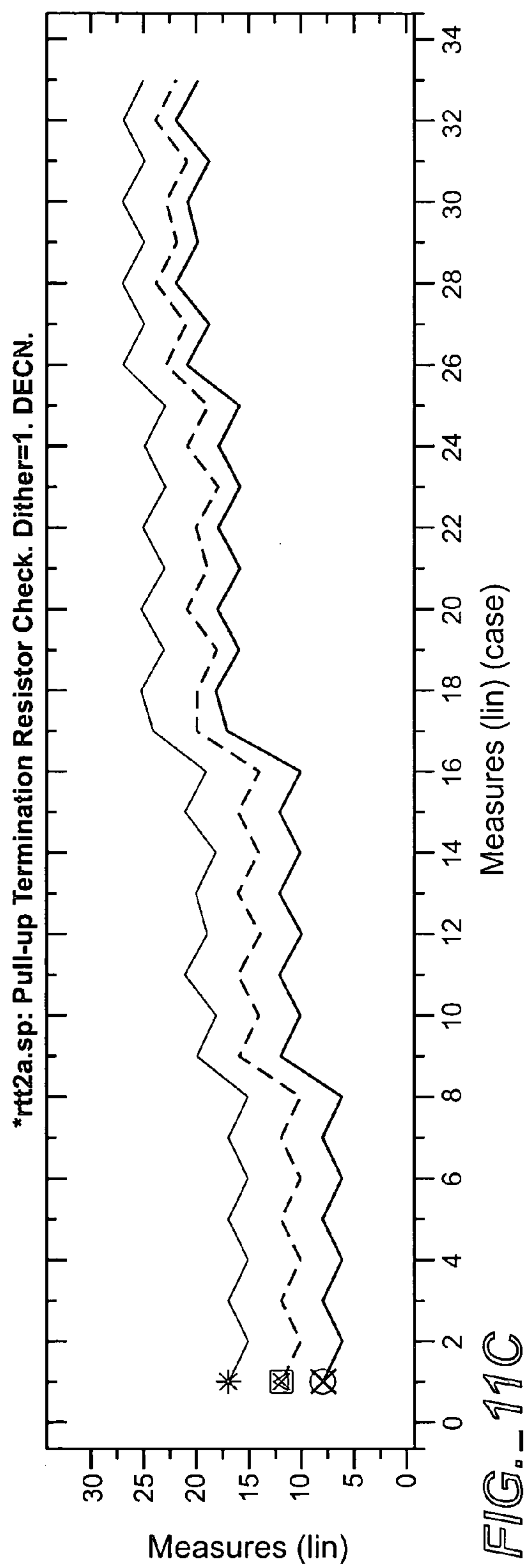
FIG._11C

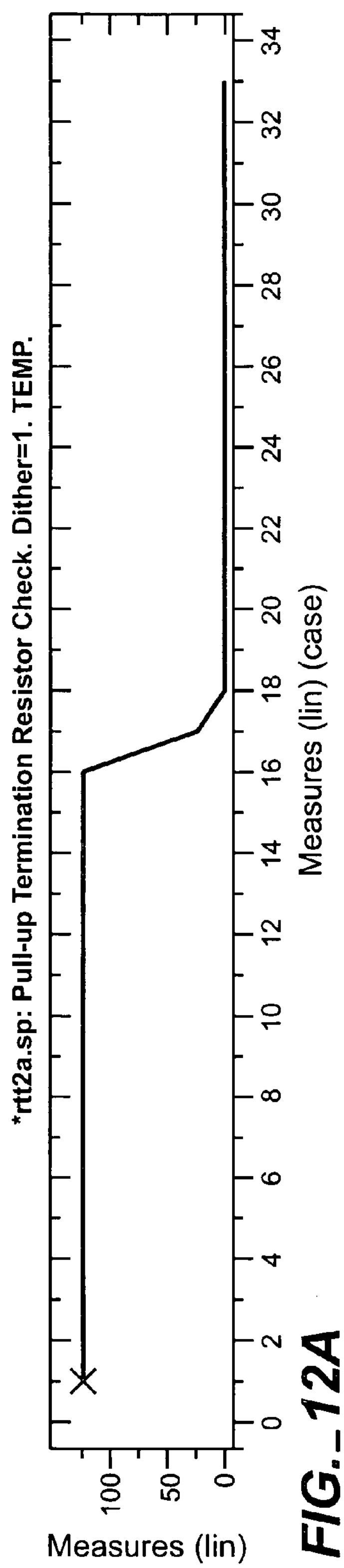
FIG._12A
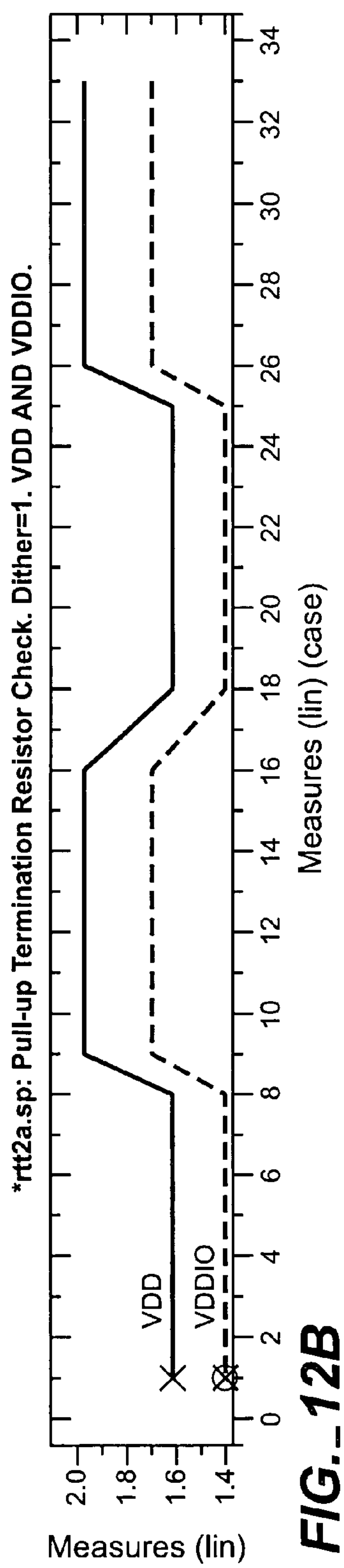
FIG._12B
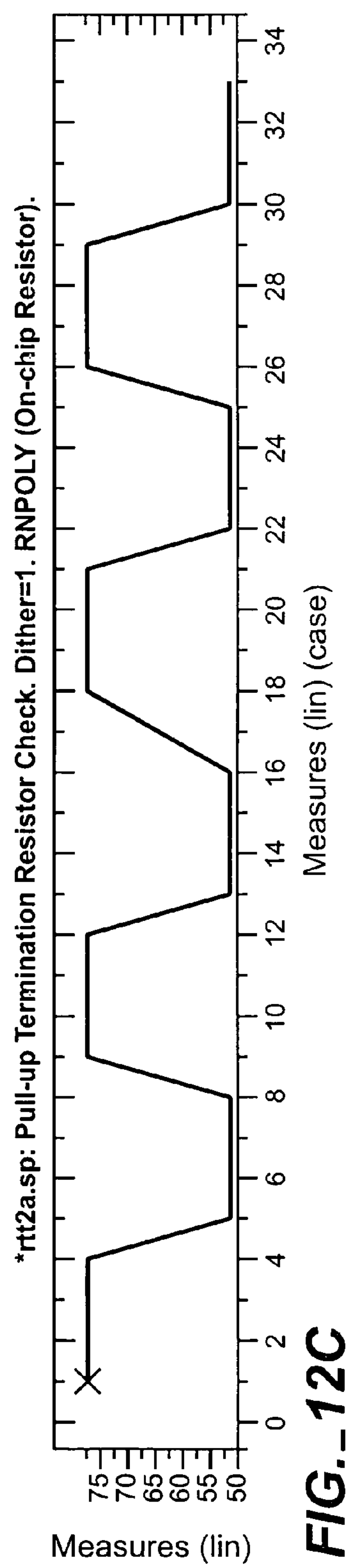
FIG._12C

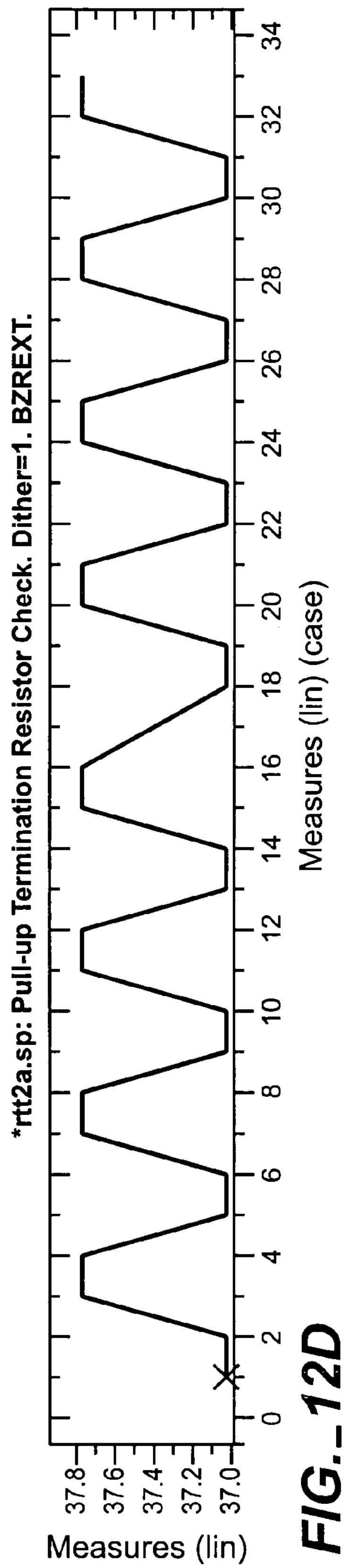
FIG._12D
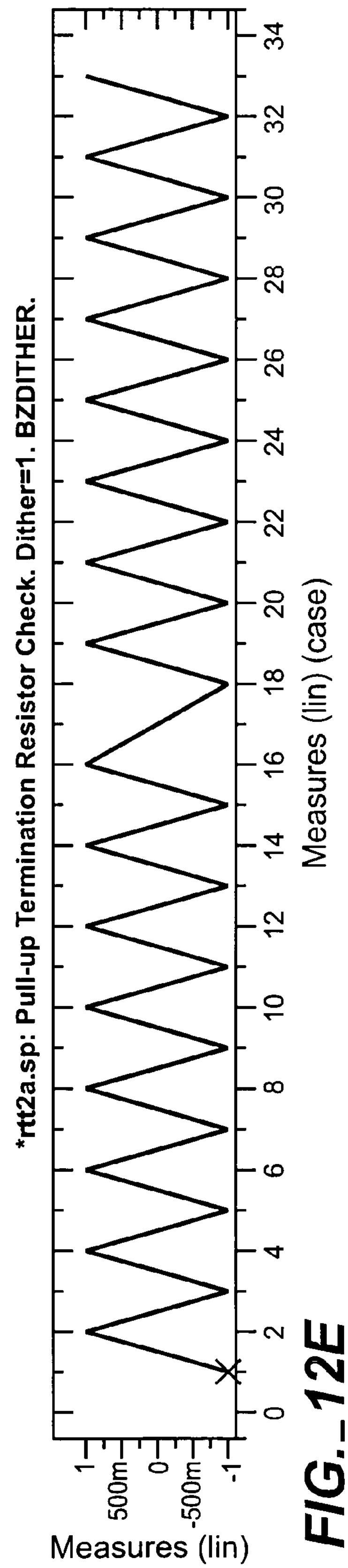
FIG._12E

BZFLASH SUBCIRCUIT TO DYNAMICALLY SUPPLY BZ CODES FOR CONTROLLED IMPEDANCE BUFFER DEVELOPMENT, VERIFICATION AND SYSTEM LEVEL SIMULATIONS

FIELD OF THE INVENTION

The present invention generally relates to control schemes for producing BZ codes to simulate impedance controlled buffers, and more specifically relates to a BZFLASH subcircuit which simulates alongside an impedance controlled buffer and provides the necessary BZ codes dynamically.

BACKGROUND OF THE INVENTION

Simulating impedance controlled input/output (I/O) buffers under actual operating conditions has been hampered by the overhead of the BZ controller. Adding the BZ controller to a transient buffer simulation adds considerable complexity and simulation time. It is not an option for ac or dc sweep simulations.

One present BZ control scheme, which is implemented in an integrated circuit (i.e. silicon), generates the Process, Voltage, Temperature and reference resistor (a.k.a. "PVT and R") compensated digital codes (a.k.a. BZ codes) used by impedance controlled buffers in the chip I/O. The scheme is essentially an ADC (Analog-to-Digital Converter) in which a counter is input to a DAC (Digital-to-Analog Converter) whose output is compared to the analog voltage being converted. The counter and comparator are in the control block, the DAC consists of the BZREFN cell plus external reference resistor for N-Codes (or BZREFP cell for P-Codes), and the analog voltage is VDDIO/2 provided by the BZVREF cell. BZ codes consist of 5 binary N-codes and 5 binary P-codes.

The existing method of simulating the impedance controlled buffers is to first determine the BZ codes. The BZ codes are usually determined with two dc sweep simulations under the desired PVT and R (Process, Voltage, Temperature and Resistance) cases. The first simulation sweeps the N-codes through the BZREFN and external resistor and records the ZIN voltages. The N-code is selected that results in a ZIN voltage just less then VREF (VDDIO/2). The second simulation sweeps the P-codes through the BZREFP for the chosen N-code and records the ZIP voltages. The P-code is selected that produces a ZIP voltage just less then VREF. Normally, the BZ codes are dithered by ±1, 2, or 4 during simulation of the impedance controlled buffer to account for on-chip variations.

The existing method of providing the necessary BZ codes to the impedance controlled buffer(s) during simulation is awkward and error-prone. Moreover, a particular BZ code is valid only for a given PVT and R, which limits an impedance controlled buffer simulation to just a single case. This one-at-a-time PVT and R simulation strategy makes design and verification difficult and time consuming.

OBJECTS AND SUMMARY OF THE INVENTION

A general object of an embodiment of the present invention is to provide a BZFLASH simulation technique which is easy to use and simulates alongside an impedance controlled buffer to provide the necessary BZ codes dynamically.

Another object of an embodiment of the present invention is to provide a BZFLASH subcircuit which makes dc sweep, ac, and transient simulations of an impedance controlled buffer possible.

Still another object of an embodiment of the present invention is to provide a BZFLASH subcircuit which provides a code dither feature to model on-chip variation.

Still yet another object of an embodiment of the present invention is to provide a BZFLASH subcircuit which provides an output in decimal code format.

Still yet another object of an embodiment of the present invention is to provide a BZFLASH subcircuit which is configurable and is accurate.

Briefly, and in accordance with at least one of the foregoing objects, an embodiment of the present invention provides a design and verification aide that can be used to produce BZ codes under static or dynamic process, voltage, temperature and external reference resistor (PVT and R) conditions for impedance controlled buffers or any other application using BZ codes. The simulation technique follows that of a flash ADC, and effectively replaces a BZ controller with a subcircuit consisting of 5 BZREFN's, 5 BZREFP's, 10 HSPICE behavioral comparators, and the BZVREF. The resulting N- and P-codes may be adjusted by a parameterized dither count with minimum and maximum code values enforced by the model, and the comparators can be modified to model offset voltage.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a diagram of a BZFLASH subcircuit which is in accordance with an embodiment of the present invention, wherein the subcircuit receives a reference voltage ("VREF") and includes an N_FLASH subcircuit and a P_FLASH subcircuit;

FIG. 2 is a diagram of a BZVREF subcircuit which provides the reference voltage ("VREF") to the BZFLASH subcircuit shown in FIG. 1;

FIG. 3 is a diagram of the N_FLASH subcircuit which is included in the BZFLASH subcircuit shown in FIG. 1, wherein the N_FLASH subcircuit includes five N_BIT_FLASH subcircuits;

FIG. 4 is a diagram of one of the N_BIT_FLASH subcircuits contained in N_FLASH subcircuit shown in FIG. 3, wherein the N_BIT_FLASH subcircuit includes a BZREFN subciruit;

FIG. 5 is a diagram of the BZREFN subciruit which is contained in the N_BIT_FLASH subcircuit shown in FIG. 4;

FIG. 6 is a diagram of the P_FLASH subcircuit which is included in the BZFLASH subcircuit shown in FIG. 1, wherein the P_FLASH subcircuit includes five P_BIT_FLASH subcircuits;

FIG. 7 is a diagram of one of the P_BIT_FLASH subcircuits contained in P_FLASH subcircuit shown in FIG. 6, wherein the P_BIT_FLASH subcircuit includes a BZREFP subciruit;

FIG. 8 is a diagram of the BZREFP subciruit which is contained in the P_BIT_FLASH subcircuit shown in FIG. 7; and FIGS. 9–12 illustrate plots which relate to BZFLASH simulations.

DESCRIPTION

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

FIG. 1 illustrates a BZFLASH subcircuit which is in accordance with an embodiment of the present invention. As will become more apparent as the subcircuit 10 is described in detail below, the subcircuit 10 resembles a flash Analog-to-Digital Converter (ADC), is easy to use and does not require a BZ controller. Additionally, the subcircuit 10 provides a code dither feature to model on-chip variation, and provides a decimal voltage format of 5-bit binary N- and P-codes, which is useful in simulation output.

As shown in FIG. 1, the BZFLASH subcircuit 10 includes an N_FLASH subcircuit 12, a P_FLASH subcircuit 14, an inverter 16 and a pair of dither blocks 18 and 20. The BZFLASH subcircuit 10 is configured to receive a reference voltage signal ("VREF") (at lead 20) and a dither count ("DITHER") (at lead 22), and is configured to output, in a decimal voltage output format, five bit binary P-codes ("EP(5:1)") and five bit binary N-codes ("EN(5:1)"). The BZFLASH subcircuit is configured such that it can be simulated alongside a controlled impedance buffer to provide the necessary BZ codes dynamically (wherein the BZ codes are the five binary N-codes ("EN(5:1)") and five binary P-codes ("EP(5:1)").

The reference voltage signal ("VREF") that is received by the BZFLASH subcircuit 10 is provided by a BZVREF subcircuit 30 that is shown in FIG. 2. As shown in FIG. 2, the BZVREF subcircuit 30 includes a pair of inverters 32, 34 and a pair of resistors 36, 38, as well as a pair of p-channel gates 40 and n-channel gates 42. The BZVREF subcircuit 30 is configured to receive input voltage signals "REN", "VDDIO" and "VSSIO", and is configured to output voltage signal "VREF" (at lead 20) to the BZFLASH subcircuit 10 shown in FIG. 1. The BZVREF subcircuit 30 is configured such that the "VREF" output signal is equal to VDDIO/2.

The N_FLASH subcircuit 12 which is contained in the BZFLASH subcircuit 10 is illustrated in more detail in FIG. 3. As shown in FIG. 3, the N_FLASH subcircuit 12 includes five N_BIT_FLASH subcircuits 50, each of which is configured to receive the reference voltage signal ("VREF") that is supplied by the BZVREF subcircuit 30. The five N_BIT_FLASH subcircuits 50 collectively output five binary output codes ("FN1"–"FN5") that are received by the P_FLASH subcircuit 14 as well as one of the DITHER blocks 18 in the BZFLASH subcircuit 10 (see FIG. 1).

Each one of the N_BIT_FLASH subcircuits 50 contained in the N_FLASH subcircuit 12 (see FIG. 3) is generally identical and is as shown in more detail FIG. 4. As shown in FIG. 4, each N_BIT_FLASH subcircuit 50 includes a BZREFN subcircuit 60 as well as an HSPICE behavioral comparator 62. The BZREFN subcircuit 60 is configured to receive inputs EN0–EN5 and is configured to output an output signal ZIN to the MINUS input of the comparator 62. The PLUS input of the comparator 62 is configured to receive the "VREF" reference voltage signal supplied by the BZVREF subcircuit 30 shown in FIG. 2.

The BZREFN subcircuit 60 which is contained in each of the N_BIT_FLASH subcircuits 50 is shown in more detail in FIG. 5. As shown, the BZREFN subcircuit 60 includes six inverters 66 and six n-channel gates 68. The BZREFN subcircuit 60 is configured to receive five input signals EN0–EN5 and is configured to output signal ZIN. The BZREFN subcircuit 60 includes an input/output pad 70 that is connected to a reference resistor ("REXT") 72, and is configured to receive input voltage VDDIO.

The P_FLASH subcircuit 14 which is contained in the BZFLASH subcircuit 10 is illustrated in more detail in FIG. 6. As shown in FIG. 6, the P_FLASH subcircuit 14 includes five P_BIT_FLASH subcircuits 80, each of which is configured to receive the reference voltage signal ("VREF") that is supplied by the BZVREF subcircuit 30. The five P_BIT_FLASH subcircuits 80 collectively output five binary output codes ("FP1"–"FP5") that are supplied to one of the DITHER blocks subcircuit 20 in the BZFLASH subcircuit 10 (see FIG. 1).

Each one of the P_BIT_FLASH subcircuits 80 contained in the P_FLASH subcircuit 14 (see FIG. 6) is generally identical and is as shown in more detail in FIG. 7. As shown in FIG. 7, each P_BIT_FLASH subcircuit 80 includes a BZREFP subcircuit 82 as well as an HSPICE behavioral comparator 84. The BZREFP subcircuit 82 is configured to receive inputs EN0–EN5 and EP1–EP5 and is configured to output a signal ZIP to the MINUS input of the comparator 84. The PLUS input of the comparator 84 is configured to receive the "VREF" reference voltage signal supplied by the BZVREF subcircuit shown in FIG. 2.

The BZREFP subcircuit 82 which is contained in each of the P_BIT_FLASH subcircuits 80 is shown in more detail in FIG. 8. As shown, the BZREFP subcircuit 82 includes twelve inverters 90, six n-channel gates 92 and six p-channel gates 94. The BZREFP subcircuit 82 is configured to receive ten input signals EN0–EN5 and EP0–EP5 and is configured to output signal ZIP.

Overall construction of the BZFLASH subcircuit 10 shown in FIG. 1 effectively consists of the following eight steps:

1) Build the behavioral comparators 62, 84 which are contained in each of the N_BIT_FLASH and P_BIT_FLASH subcircuits 50, 80 (see FIGS. 4 and 7). The behavioral comparators 62, 84 are used to reduce circuit size and simulation overhead. Preferably, each of the behavioral comparators 62, 84 are built using a voltage-controlled voltage source whose output is defined by an equation involving the PLUS and MINUS inputs of the comparator 62, 84. A key criteria for each comparator 62, 84 is that the OUTPUT must resolve to only one of two possible states regardless of the magnitude of the difference between PLUS and MINUS. In the present embodiment, if PLUS is greater or equal to MINUS, then OUTPUT is VDD. If PLUS is less that MINUS, then OUTPUT is VSS.
2) Create the voltage reference. Place and enable the BZVREF cell 30 (see FIG. 2) which creates "VREF" which is equal to VDDIO/2.
3) Build the N_BIT_FLASH subcircuits 50 (see FIG. 4). This is a bit-slice of the N-code FLASH ADC consisting of the reference resistor REXT 72 (see FIG. 5), the BZREFN cell 60, and the behavioral comparator 62. Connect resistor 72 (REXT) between VDDIO and the input\output pad 70 of the BZREFN subcircuit 60. Connect the VREF (lead 20) from the BZVREF subcircuit 30 to the PLUS input of the behavioral comparator 62 and the VIN output from the BZREFN subcircuit 60 to the MINUS input of the behavioral comparator 62.

4) Build the N-FLASH subcircuit 12 (see FIG. 3). Place five instances of the N_BIT_FLASH 50 (see FIG. 4) into the N_FLASH subcircuit 12. Each N_BIT_FLASH subcircuit 50 determines one bit in the flash N-code, FN(5:1). Begin with the most significant bit (MSB=FN5). Tie its corresponding EN5 input high (disabled) and all lower EN(4:1) inputs low (enabled). The comparator output 62 becomes the final FN5 that also connects to the EN5 inputs of all lower order N_BIT_FLASH's. Connect the remaining N_BIT_FLASH's in like manner. Tie all EN0 ports to ground.

5) Build the P_BIT_FLASH subcircuit 80 (see FIG. 7). This is a bit slice of the P-code FLASH ADC consisting of the BZREFP cell 82 (see FIG. 8) and the behavioral comparator 84. Connect the VREF from the BZVREF cell 30 to the PLUS input of the behavioral comparator 84 and the VIP output from the BZREFP subcircuit 82 to the MINUS input of the behavioral comparator 84.

6) Build the P-FLASH subcircuit 14 (see FIG. 6). Place five instances of the P_BIT_FLASH subcircuit 80 (see FIG. 7) into the P_FLASH subcircuit 14. Each P_BIT_FLASH subcircuit 14 determines one bit in the flash P-code, FP(5:1). First, connect FN(5:1) outputs from the N_FLASH subcircuit 12 to the EN(5:1) input ports of all local P_BIT_FLASH's. Tie all EN0 ports to ground and all EP0 ports to VDD. Begin with the most significant bit (MSB=FP5). Tie its corresponding EP5 input high (enabled) and all lower EP(4:1) inputs low (disabled). The comparator 84 output becomes the final FP5 that also connects to the EP5 inputs of all lower order P_BIT_FLASH's. Connect the remaining P_BIT_FLASH's in like manner.

7) Build the DITHER blocks 18, 20. The dither blocks 18, 20 are configured such that the dither function of the BZFLASH subcircuit 10 takes in a 5-bit binary value, performs a binary-to-decimal conversion, adds a dither amount, enforces minimum (0) and maximum (31) count constraints, performs a decimal-to-binary conversion on the result, and outputs both the decimal and binary dithered values. Care must be taken to perform the operations in the electrical domain so as not to impose a simulation step penalty.

8) Instantiate the DITHER blocks 18, 20 at outputs of the N_FLASH and P_FLASH subcircuits 12, 14. Dither count is added to FP(5:1) and subtracted from FN(5:1) to create final EP(5:1) and EN(5:1), respectively.

The BZFLASH subcircuit 10 shown in FIG. 1 and built as described above has the following features:

1) Ease of use. The BZFLASH subcircuit 10 is configured to simulate alongside an impedance controlled buffer to provide the necessary BZ codes dynamically. This makes dc sweep, ac, and transient simulations of the buffer possible.

2) Code dither. The BZFLASH subcircuit 10 incorporates a BZ code dither feature (via DITHER blocks 18, 20) to model on-chip variation. The dither count is subtracted from N-code and added to P-code in a manner to increase drive strength. Dither count can be a positive or negative integer value. Dithered BZ codes are restricted to within the minimum (0) and maximum (31) counts by the model. Preferably, dither counts of ±1,2, or 4 are used to account for comparator input referred offset voltage and other on-chip variations.

3) Decimal code output. The BZFLASH subcircuit 10 provides a decimal voltage format of the 5-bit binary N- and P-codes. The decimal output is useful in simulation output.

4) Configurable and accurate. The BZFLASH subcircuit 10 can be configured to match the actual BZ controller ADC end states. Presently, N-code conversions result in a ZIN voltage from BZREFN (i.e. the DAC output) that is just below the VREF voltage from BZVREF. Similarly for P-code. A particular BZFLASH version may be created which incorporates the postlayout netlists of the actual BZ reference cells used in the chip design.

The BZFLASH subcircuit 10 shown in FIG. 1 can also be configured in order to:

1) Add parameterized offset voltage to the comparator model.

2) Run BZFLASH off of mirrored vdd, vss, vddio, and vssio sources so as not to interfere with buffer current measurements.

3) Build a library of BZFLASH subcircuits. Include standard VDDIO voltage configurations like BZFLASH (1.8v), BZFLASHLS25 (2.5V), and BZFLASHLS33 (3.3V) as well as custom configurations like BZFLASH_AGP and BZFLASH_PCI.

4) Capture BZFLASH in the ViewDraw schematic tool (or other SPICE netlistable drawing tool) to make updating, new configurations, and technology migrations easier.

The functionality of the BZFLASH subciruit 10 shown in FIG. 1 can be coded into a circuit simulation package other than HSPICE. This may include, but may not be limited to: SPICE, PSPICE, and SABER. The overall functionality of the BZFLASH subciruit could also conceivably be implemented in other programs such as MathCAD or spreadsheets like Excel.

FIGS. 9A–12E illustrate plots which relate to BZFLASH simulations. Specifically, FIGS. 9A and 9B contain two output plots from a BZFLASH simulation wherein BZFLASH codes were connected to BZREFN and BZREFP cells. The supply voltage (VDDIO=S18) was swept from 1.62V to 1.98V in 0.1V increments. FIG. 9A shows the decimal N- and P-code (decn and deep) versus VDDIO, and FIG. 9B shows that the BZREFN and BZREFP outputs (zn and zp) remain below the VREF voltage (VDDIO/2) as intended.

FIGS. 10A–10C contain three output plots from a BZFLASH simulation wherein BZFLASH codes were connected to BZREFN, BZREFP, and two controlled impedance buffers, BZ50T. Dither was swept from −31 to +31 by 1. FIG. 10A shows the dithered BZFLASH codes (decn and decp) and the un-dithered raw codes (fdecn and fdecp) versus dither. FIG. 10B shows the BZREFN and BZREFP outputs (ZIN and ZIP) along with the reference VREF versus dither. FIG. 10C shows the BZ50T pull-down and pull-up output impedances (Rnio and Rpio) versus dither. Note that Rnio and Rpio are about 50 ohms at a dither of zero. Also note that a ±4 dither count corresponds to about a ±10% variation in the output impedances.

FIGS. 11A–11C contain three output plots from an on-chip termination (RTT) simulation using a custom I/O buffer and BZFLASH subcircuit. FIG. 11A shows the minimum (rttn) and maximum (rttf) RTT for seven process corners versus "case". "Case" refers to the mixture of temperature, voltage, on-chip poly resistor value, off-chip reference resistor value, and dither. The "case" legend plot is given in FIGS. 12A–12E. RTT target is 41 ohms±12.2%. Measured minimum is 34.7 ohms and maximum is 45.72 ohms. FIG. 11B shows the decimal P-code (decp) variation versus "case". FIG. 11C shows the decimal N-code (decn) variation versus "case".

FIGS. 12A–12E are the "case" legends referred to above in connection with FIGS. 11A–11C. FIGS. 12A–12E contain five plots equating TEMP, VDD, VDDIO, RNPOLY, BZREXT, and BZDITHER settings to "case" numbers. "Case" numbers equate to permutations of the min/max combinations of 5 variables plus one for the nominal condition. So there are (2^5)+1 or 33 cases.

The BZFLASH subcircuit shown in FIG. 1 is rendered to a BZFLASH Spice subcircuit netlist within a BZFLASH library module in LISTING 1 below.

Listing 1:

```
.LIB BZFLASH
*Function: BZFLASH generates EN(5:1) and EP(5:1) codes for dc sweep, ac,
*and transient simulations of impedance controlled buffers.
*Assigned parameter names: xdither, bzdither, rref, bzrref, bzrext, rext.
*Assigned function names: RND, DEC2VBIN.
.global vdd vss vddio vssio
.PROTECT MODELS
.lib '../cells/bz50refn.iclib' bz50refn
.lib '../cells/bz50refp.iclib' bz50refp
.lib '../cells/bzvref.iclib' bzvref
***** Model Templates
*.subckt bzflash en1 en2 en3 en4 en5 ep1 ep2 ep3 ep4 ep5 vref decn decp
*+bzdither=0 bzrext=rext
*.SUBCKT BZREF I0 Z A
*.SUBCKT BZ50REFN IO Z EN0 EN1 EN2 EN3 EN4 EN5 EP0 EP1 EP2 EP3 EP4 EP5
*.SUBCKT BZ50REFP Z EN0 EN1 EN2 EN3 EN4 EN5 EP0 EP1 EP2 EP3 EP4 EP5
*****Functions
.param RND (num)='int (num+0.5)'
.param DEC2VBIN (num,pot)='int(((num/pow(2,pot))-int (num/pow (2,pot)))+0.5)'
*****Subcircuits
.subckt bzflash en1 en2 en3 en4 en5 ep1 ep2 ep3 ep4 ep5 vref decn decp
+bzdither=0 bzrext=rext
*BZ Flash Conversion with dither.
*Voltages at decn and decp are the decimal equivalents to en (5:1) and ep (5:1).
*Parameter 'bzdither' subtracts from N-code (fdecn) and adds to P-code.
*Requires global vddio, vdd, vssio, vss.
xvref bzvdd vref, vdd bzvref
xncode fn1 fn2 fn3 fn4 fn5, vref n__flash bzrref=bzrext
xpcode fp1 fp2 fp3 fp4 fp5, vref fn1 fn2 fn3 fn4 fn5 p__flash
xfdecn fdecn, fn5 fn4 fn3 fn2 fn1 vbin2dec
xfdecp fdecp, fp5 fp4 fp3 fp2 fp1 vbin2dec
xndither en1 en2 en3 en4 en5 decn, fdecn dither xdither='-1*bzdither'
xpdither ep1 ep2 ep3 ep4 ep5 decp, fdecp dither xdither 'bzdither'
.ends bzflash
.subckt vbin2dec decimal, b4 b3 b2 b1 b0
*Voltage BINary to DECimal (MSB=b4, LSB=b0).
*Requires global vdd.
edecimal decimal 0 VOL='RND ((v(b0)+2*v(b1)+4*v(b2) +8*v(b3)+16*v(b4))/v(vdd))'
rdecimal decimal 0 1 Meg
.ends vbin2dec
.subckt cmp out, pos neg
*Comparator Out={0, vdd}.
*Requires global vdd.
ecmp out 0 vol='v(vdd)*(1+sgn(0.5+sgn(v(pos,neg))))/2'
rcmp out 0 1 Meg
.ends cmp
.subclt n__bit flash pbit, vref en0 en1 en2 en3 en4 en5 rref=50
*Bit slice of N-code Flash ADC (DAC and comparator).
*BZREFN's resistor "rref" is connected to external VDDIO instead of internal.
*Requires global vddio, vdd, vssio, vss.
*.SUBCKT BZ50REFN IO Z EN0 EN1 EN2 EN3 EN4 EN5 EP0 EP1 EP2 EP3 EP4 EP5
xrefn io z, en0 en1 en3 en4 en5, vss vss vss vss vss vss bz50refn
rref vddio io rref
xcmp nbit, vref z cmp
*.probe dc v(z)
ends n__bit flash
.subckt p__bit__flash pbit, vref en0 en1 en2 en3 en4 en5 ep0 ep1 ep2 ep3 ep4 ep5
*Bit slice of P-code Flash ADC (DAC and comparator).
*Requires global vddio, vdd, vssio, vss.
*.SUBCKT BZ50REFP Z EN0 EN1 EN2 EN3 EN4 EN5 EP0 EP1 EP2 EP3 EP4 EP5
xrefp z, en0 en1 en2 en3 en4 en5 ep0 ep1 ep2 ep3 ep4 ep5 bz50refp
xcmp pbit, vref z cmp
probe dc v(z)
ends p__bit flash
.subckt n__flash en1 en2 en3 en4 en5, vref bzrref=50
*BZN Flash Conversion. N-Code flash voltage just below Vref.
*Requires global vddio, vdd, vssio, vss.
xn5 en5, vref vss vss vss vss vss vdd n__bit__flash rref—bzrref
xn4 en4, vref vss vss vss vss vdd en5 n__bit__flash rref=bzrref
xn3 en3, vref vss vss vss vdd en4 en5 n__bit__flash rref-bzrref
xn2 en2, vref vss vss vdd en3 en4 en5 n__bit__flash rref-bzrref
xn1 en1, vref vss vdd en2 en3 en4 en5 n__bit__flash rref=bzrref
.ends n__flash
.subckt p__flash ep1 ep2 ep3 ep4 ep5, vref en1 en2 en3 en4 en5
*BZP Flash Conversion. P-code flash voltage just below Vref.
*Requires global vddio, vdd, vssio, vss.
xp5 ep5, vref vss en1 en2 en3 en4 en5 vdd vss vss vss vss vdd p__bit__flash
xp4 ep4, vref vss en1 en2 en3 en4 en5 vdd vss vss vss vdd ep5 p__bit__flash
xp3 ep3, vref vss en1 en2 en3 en4 en5 vdd vss vss vdd ep4 ep5 p__bit__flash
xp2 ep2, vref vss en1 en2 en3 en4 en5 vdd vss vdd ep3 ep4 ep5 p__bit__flash
xp1 ep1, vref vss en1 en2 en3 en4 en5 vdd vdd ep2 ep3 ep4 ep5 p__bit__flash
ends p__flash
.subckt dither ex1 ex2 ex3 ex4 ex5 out__decx in decx xdither=0
*BZ Code Count Dither
*Add dither to code, limit range to 0–31, and integerize.
```

```
esum out_decx 0 VOL='RND (min(31,max(0,(v(in decx)
   +xdither))))'
rsum out_decx 0 1 Meg
*Generate new dithered code.
eex1 ex1 0 VOL='v(vdd)*DEC2VBIN (v(out_decx),1)'
eex2 ex2 0 VOL='v(vdd)*DEC2VBIN (v(out_decx),2)'
eex3 ex3 0 VOL='v(vdd)*DEC2VBIN (v(out_decx),3)'
eex4 ex4 0 VOL='v(vdd)*DEC2VBIN (v(out_decx),4)'
eex5 ex5 0 VOL='v(vdd)*DEC2VBIN (v(out_decx),5)'
rex1 ex1 0 1 Meg
rex2 ex2 0 1 Meg
rex3 ex3 0 1 Meg
rex4 ex4 0 1 Meg
rex5 ex5 0 1 Meg
.ends dither
.ENDL BZFLASH
```

The BZFLASH subcircuit shown in FIG. 1 and rendered to the BZFLASH Spice subcircuit netlist given in LISTING 1 is easy to use and simulates alongside an impedance controlled buffer to provide the necessary BZ codes dynamically. The BZFLASH subcircuit makes dc sweep, ac, and transient simulations of an impedance controlled buffer possible. The BZFLASH subcircuit provides a code dither feature to model on-chip variation and provides an output in decimal code format. The BZFLASH subcircuit is also configurable and is accurate.

While an embodiment of the present invention is shown and described, it is envisioned that those skilled in the art may devise various modifications of the present invention without departing from the spirit and scope of the appended claims.

What is claimed is:

1. A BZFLASH subcircuit configured to simulate alongside an impedance controlled buffer and provide BZ codes dynamically to the impedance controlled buffer, said subcircuit comprising:

a BZVREF subcircuit configured to provide a reference voltage equal to the I/O supply voltage divided by two;

a P_FLASH subcircuit configured to receive the reference voltage from the BZVREF subcircuit and configured to supply a plurality of binary output codes;

an N_FLASH subcircuit configured to receive the reference voltage from the BZVREF subcircuit, said N_FLASH subcircuit connected to said P_FLASH subcircuit and configured to supply a plurality of binary output codes to the P_FLASH subcircuit;

a first dither block connected to the N_FLASH subcircuit, said first dither block configured to receive a dither count and the plurality of binary output codes from the N_FLASH subcircuit and configured to subtract the dither count from the plurality of binary output codes received from the N_FLASH subcircuit and provide output codes in both a binary and a decimal voltage format; and a second dither block connected to the P_FLASH subcircuit, said second dither block configured to receive a dither count and the plurality of binary output codes from the P_FLASH subcircuit and configured to add the dither count from the plurality of binary output codes received from the P_FLASH subcircuit and provide output codes in both a binary and a decimal voltage format.

2. A BZFLASH subcircuit as defined in claim 1, wherein said BZVREF subcircuit includes a resistive voltage divider between the I/O supply and ground.

3. A BZFLASH subcircuit as defined in claim 1, wherein said P_FLASH subcircuit includes a plurality of P_BIT_FLASH subcircuits which collectively output the binary output codes which are supplied to the second dither block.

4. A BZFLASH subcircuit as defined in claim 3, wherein each P_BIT_FLASH subcircuit includes a BZREFP subcircuit and a behavioral comparator which is configured to receive the reference voltage from the BZVREF subcircuit and an output signal from the BZREFP subcircuit.

5. A BZFLASH subcircuit as defined in claim 4, wherein each behavioral comparator is configured such that if the reference voltage which is received from the BZVREF subcircuit is greater or equal to the output signal received from the BZREFP subcircuit, then the behavioral comparator outputs VDD, and if the reference voltage which is received from the BZVREF subcircuit is less than the output signal received from the BZREFP subcircuit, then the behavioral comparator outputs VSS.

6. A BZFLASH subcircuit as defined in claim 4, wherein the BZREFP subcircuit includes a plurality of p-channel gates configured to receive a first set of inputs and a plurality of n-channel gates configured to receive a second set of inputs.

7. A BZFLASH subcircuit as defined in claim 1, wherein said N_FLASH subcircuit includes a plurality of N_BIT_FLASH subcircuits which collectively output the binary output codes which are supplied to the P_FLASH subcircuit and the first dither block.

8. A BZFLASH subcircuit as defined in claim 7, wherein each N_BIT_FLASH subcircuit includes a BZREFN subcircuit and a behavioral comparator which is configured to receive the reference voltage from the BZVREF subcircuit and an output signal from the BZREFN subcircuit.

9. A BZFLASH subcircuit as defined in claim 8, wherein each behavioral comparator is configured such that if the reference voltage which is received from the BZVREF subcircuit is greater or equal to the output signal received from the BZREFN subcircuit, then the behavioral comparator outputs VDD, and if the reference voltage which is received from the BZVREF subcircuit is less than the output signal received from the BZREFN subcircuit, then the behavioral comparator outputs VSS.

10. A BZFLASH subcircuit as defined in claim 8, wherein the BZREFN subcircuit includes a plurality of n-channel gates configured to receive a set of inputs and an input pad configured to receive a voltage input through an external reference resistor connectable to the input pad.

11. A BZFLASH subcircuit configured to simulate alongside an impedance controlled buffer and provide BZ codes dynamically to the impedance controlled buffer, said subcircuit comprising:

a BZVREF subcircuit configured to provide a reference voltage equal to the I/O supply voltage divided by two;

a P_FLASH subcircuit configured to receive the reference voltage from the BZVREF subcircuit and configured to supply a plurality of binary output codes;

an N_FLASH subcircuit configured to receive the reference voltage from the BZVREF subcircuit, said N_FLASH subcircuit connected to said P_FLASH subcircuit and configured to supply a plurality of binary output codes to the P_FLASH sub circuit;

a first dither block connected to the N_FLASH subcircuit, said first dither block configured to receive a dither count and the plurality of binary output codes from the N_FLASH subcircuit and configured to subtract the dither count from the plurality of binary output codes received from the N_FLASH subcircuit and provide output codes in both a binary and a decimal voltage format; and a second dither block connected to the P_FLASH subcircuit, said second dither block configured to receive a dither count and the plurality of binary output codes from the P_FLASH subcircuit and configured to add the dither count from the plurality of binary output codes received from the P_FLASH subcircuit and provide output codes in both a binary and a decimal voltage format, wherein said BZVREF subcircuit includes a resistive voltage divider between the I/O supply and ground, wherein said P_FLASH subcircuit includes a plurality of P_BIT_FLASH subcircuits which collectively output the binary output codes which are supplied to the second dither block, wherein each P_BIT_FLASH subcircuit includes a BZREFP subcircuit and a behavioral comparator which is configured to receive the reference voltage from the BZVREF subcircuit and an output signal from the BZREFP subcircuit, wherein each behavioral comparator in each P_BIT_FLASH subcircuit is configured such that if the reference voltage which is received from the BZVREF subcircuit is greater or equal to the output signal received from the BZREFP subcircuit, then the behavioral comparator outputs VDD, and if the reference voltage which is received from the BZVREF subcircuit is less than the output signal received from the BZREFP subcircuit, then the behavioral comparator outputs VSS, wherein the BZREFP subcircuit includes a plurality of p-channel gates configured to receive a first set of inputs and a plurality of n-channel gates configured to receive a second set of inputs, wherein said N_FLASH subcircuit includes a plurality of N_BIT_FLASH subcircuits which collectively output the binary output codes which are supplied to the P_FLASH subcircuit and the first dither block, wherein each N_BIT_FLASH subcircuit includes a BZREFN subcircuit and a behavioral comparator which is configured to receive the reference voltage from the BZVREF subcircuit and an output signal from the BZREFN subcircuit, wherein each behavioral comparator in each N_BIT_FLASH subcircuit is configured such that if the reference voltage which is received from the BZVREF subcircuit is greater or equal to the output signal received from the BZREFN subcircuit, then the behavioral comparator outputs VDD, and if the reference voltage which is received from the BZVREF subcircuit is less than the output signal received from the BZREFN subcircuit, then the behavioral comparator outputs VSS, wherein the BZREFN subcircuit includes a plurality of n-channel gates configured to receive a set of inputs and an input pad configured to receive a voltage input through an external reference resistor connectable to the input pad.

* * * * *